United States Patent
Wang

(10) Patent No.: US 7,969,188 B2
(45) Date of Patent: Jun. 28, 2011

(54) METHOD AND APPARATUS FOR PROVIDING A NON-VOLATILE PROGRAMMABLE TRANSISTOR

(75) Inventor: Man Wang, Saratoga, CA (US)

(73) Assignee: Man Wang, Saratoga, CA (US)

( * ) Notice: Subject to any disclaimer, the term of this patent is extended or adjusted under 35 U.S.C. 154(b) by 0 days.

(21) Appl. No.: 12/880,522

(22) Filed: Sep. 13, 2010

(65) Prior Publication Data

US 2010/0327905 A1    Dec. 30, 2010

Related U.S. Application Data

(62) Division of application No. 12/059,509, filed on Mar. 31, 2008, now Pat. No. 7,816,947.

(51) Int. Cl.
*H03K 19/173* (2006.01)
*H03K 19/20* (2006.01)
*H03K 19/094* (2006.01)

(52) U.S. Cl. .................. 326/49; 326/38; 365/185.14

(58) Field of Classification Search ............. 326/38, 326/49, 50; 365/185.14
See application file for complete search history.

(56) References Cited

U.S. PATENT DOCUMENTS 5,338,952 A * 8/1994 Yamauchi ............... 365/185.15
6,243,293 B1 * 6/2001 Van Houdt et al. ...... 365/185.14

* cited by examiner

*Primary Examiner* — Daniel D Chang
(74) *Attorney, Agent, or Firm* — James M. Wu; JW Law group

(57) ABSTRACT

A method and apparatus of providing a programmable system using non-volatile programmable transistors are disclosed. A programmable logic circuit, in one embodiment, includes a first programmable transistor and a second programmable transistor. The first programmable transistor includes a first gate terminal, a first source terminal, a first drain terminal, and a first programming terminal. The second programmable transistor includes a second gate terminal, a second source terminal, and a second drain terminal, and a second programmable terminal. The first and second programmable transistors include non-volatile memory elements. The first and the second gate terminals are coupled to an input terminal, and the first drain terminal and the second source terminal are coupled to an output terminal to perform a logic function.

19 Claims, 11 Drawing Sheets

| Function | In | Logic Gate | Control Gate | N-Cell Charge | Out | Note |
|---|---|---|---|---|---|---|
| Off | X | X | Programming | Strong Negative | Z | |
| On | 0/1 | X or 1*1 | Erasing | Strong Positive | 0/1 | |

Notes: X: Don't care  Z: High impedance

| Function | In | Logic Gate | Control Gate | N-Cell Charge | Out | Note |
|---|---|---|---|---|---|---|
| Off | X | X | Programming | Strong Negative | Z | |
| On | 0/1 | X or 1*1 | Erasing | Strong Positive | 0/1 | |

Notes: X: Don't care  Z: High impedance

| Function | In | V1 | V2 | P-Cell Charge | N-Cell Charge | Out | Note |
|---|---|---|---|---|---|---|---|
| Inverting | 0/1 | Vdd | Gnd | Strong Negative | Strong Positive | 1/0 | |
| Buffering | 0/1 | Gnd | Vdd | Strong Negative | Strong Positive | 0/1 | Vt Loss |
| Switch-Off | X | X | X | Strong Positive | Strong Negative | Z | |
| Logic High | X | Vdd | X | Strong Negative | Strong Negative | 1 | |
| Logic Low | X | X | Gnd | Strong Positive | Strong Positive | 0 | |

X: Don't care   Z: High impedance

METHOD AND APPARATUS FOR PROVIDING A NON-VOLATILE PROGRAMMABLE TRANSISTOR

PRIORITY

The present application is a divisional application of co-pending U.S. patent application Ser. No. 12/059,509, entitled "Method and Apparatus for Providing a Non-Volatile Programmable Transistor," filed on Mar. 31, 2008, the disclosure of which is incorporated herein by reference.

FIELD

The exemplary embodiment(s) of the present invention relates to the field of semiconductor and integrated circuits. More specifically, the exemplary embodiment(s) of the present invention relates to non-volatile programmable logic devices.

BACKGROUND

Semiconductor integrated chips, which could be a complementary metal oxide semiconductor ("CMOS") based technology, are widely used for various electronics as well as consumer industries. The CMOS technology and/or fabrication process is commonly used to design and manufacture n-type and/or p-type transistors, inverters, buffers, pass-gates, transmission gate switches, look-up tables, and multiplexers. A problem, however, associated with a typical CMOS based component is that it contains rigid design requirements, which are typically incompatible with other technologies such as non-volatile memory technologies. As such, a typical CMOS logic device and a non-volatile memory device are generally not fabricated on the same chip or die at the same process node.

Another problem associated with conventional standard CMOS transistors is the complexity of voluminous libraries as well as device leakage current. For example, field programmable gate arrays ("FPGA") is a typically CMOS based device using look-up tables and static random access memory ("SRAM") and it usually suffers sizable leakage current, which adversely impacts its performance and power consumption.

SUMMARY

A method and apparatus for providing a programmable system using non-volatile programmable transistors are disclosed. A programmable logic system, in one embodiment, includes a first programmable transistor and a second programmable transistor, wherein each of the programmable transistors includes a gate terminal, a source terminal, a drain terminal, and a programming terminal. The first and second programmable transistors further include non-volatile memory elements, which, in one example, are used to activate or deactivate the logic function of the programmable transistors. When the non-volatile memory elements are set, the first and the second programmable transistors can be configured to perform logic functions, such as an inverting function, a buffering function, switching or a stable logic level.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
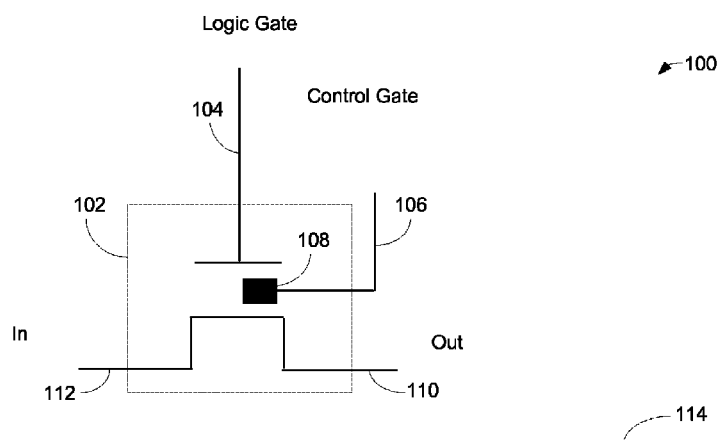
FIG. 1 is a schematic diagram illustrating a programmable transistor in accordance with one embodiment of the present invention.

Embodiments of the present invention are described herein in the context of a method, system and apparatus for providing programmable logic functions using programmable transistors.

Those of ordinary skilled in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

In the interest of clarity, not all of the standard hardware and routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

Moreover, it will be appreciated that such a development effort might be complex and time-consuming, but would nevertheless be a routine undertaking of engineering for those of ordinary skilled in the art having the benefit of this disclosure.

In accordance with the embodiment(s) of the present invention, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), application specific standard product (ASSP), system on chip (SoC) or the like, may be designed and fabricated by the embodiment of the present inventive disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory. It should be noted that non-volatile memory technology used for the inventive programmable transistors includes flash, silicon-oxide-nitride-oxide-silicon ("SONOS"), metal-oxide-nitride-oxide-silicon ("MONOS"), under-lapped source CMOS or electrically erasable programmable read only memory ("EEPROM").

As used herein, the symbol n+ indicates an n-doped semiconductor material having a doping level of n-type dopants on the order of $10^{21}$ atoms per cubic centimeter. The symbol n− indicates an n-doped semiconductor material typically having a doping level on the order of $10^{17}$ atoms per cubic centimeter. The symbol p+ indicates a p-doped semiconductor material typically having a doping level of p-type dopants on the order of $10^{21}$ atoms per cubic centimeter. The symbol p− indicates a p-doped semiconductor material typically having a doping level on the order of $10^{17}$ atoms per cubic centimeter. Those of ordinary skill in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skill in the art. Such persons of ordinary skill in the art will now also realize that a range of doping concentrations around those described above will also work. Essentially, any process capable of forming pFETs and nFETs will work. Doped regions may be diffusions or they may be implanted.

The embodiment(s) of the present invention illustrates a programmable logic system using non-volatile programmable transistors. A programmable logic system, in one embodiment, includes a first programmable transistor and a second programmable transistor, wherein each of the programmable transistors includes a gate terminal, a source terminal, a drain terminal, and a programming terminal. The first and second programmable transistors further include non-volatile memory elements, which, in one example, are used to activate or deactivate the logic function of the programmable transistors. When the non-volatile memory elements are set, the first and the second programmable transistors can be configured to perform logic functions, such as an inverting function, a buffering function, switching off or a stable logic level.

FIG. 1 is a schematic diagram 100 illustrating a programmable transistor 102 in accordance with one embodiment of the present invention. Diagram 100 includes a programmable transistor ("ViLA") 102 and a table 114, wherein table 114 is a truth table associated with programmable transistor 102. Truth table 114, which may be a mathematical table, illustrates logic expressions that can be performed or rendered by ViLA 102. It should be noted that the underlying concept of the exemplary embodiment(s) of the present invention would not change if one or more blocks (circuit or elements) were added to or removed from diagram 100.

ViLA 102, in one embodiment, includes a logic gate terminal 104, a source terminal 112, a drain terminal 110, a control gate terminal 106, and a programmable memory element 108. Programmable memory element 108 is capable of selectively switching ViLA 102 from a logic element to a static element and vice versa. A logic element, for example, is capable of performing a logic function such as an inverting or a buffering function. A static element, on the other hand, is capable of providing a stable logic signal, such as high impedance, logic 1, logic zero, or the like.

Diagram 100 essentially illustrates a basic ViLA component, which can be used to perform basic logic functions and/or a sophisticated logic functions with multiple ViLA basic building components. As indicated by table 114, ViLA 102 is capable of performing logic functions described in table 114. It should be noted that the characteristics of programmability of ViLA 102 is similar to conventional flash memories, SONOS, MONOS, EEPROM or under-lapped source CMOS. The logic function of ViLA 102, for instance, is turned off when control gate 106 is active or in a "programming" state, which indicates that programmable memory element 108 is charged with sufficient high (negative) potential. Alternatively, if control gate 106 is inactive or in an "erasing" state and logic gate 104 is active, drain terminal 110 outputs the same or substantially the same signals as the signals at source terminal 112. ViLA 102, in one embodiment, is a basic building block, wherein multiple ViLAs 102 can be arranged to perform a specific logic function as well as remember information in its non-volatile memory element 108. For example, two ViLAs 102 may be used to compose a transmission gate, which can be done with a pair of n-type ViLA and n-type ViLA.

An advantage of using ViLA 102 is to implement both non-volatile memory and logic function on the same die, which can be fabricated using a standard semiconductor manufacturing process such as a non-volatile memory process or CMOS technology. It should be noted that using ViLA 102 as a basic circuit or building block makes a single die solution feasible, wherein the signal die, for example, includes reprogrammable logic interface, flexible controller, high-density non-volatile memory cells, and the like. Note that ViLA based circuits provide features such as integrating logic and non-volatile memory onto a single transistor or a single die. The benefit of integrating non-volatile memory feature and logic feature includes conserving power, reducing die size, providing programmability, enhancing gate density, providing stronger immunity to single event upset ("SEU") and scalability.

Another advantage of using ViLA 102 is to reduce the size of standard cell library by integrating multiple functions such as programmability, non-volatility, and static power conservation into a single entity. The ViLA based circuitry provides a solution to integrate the features of non-volatile memory and programmability into various libraries for logic circuitry. It should be noted that standard libraries for logic circuitry include application-specific integrated circuit ("ASIC"), application-specific standard product ("ASSP"), field programmable gate array ("FPGA"), and/or programmable logic device ("PLD").

Another advantage of using ViLA 102 is to enhance the performance of a programmable device by replacing the traditional FPGA or PLD cells with the ViLA-based cells since the ViLA-based cells require smaller die size and consume less power. Similarly, the ViLA circuitry can also reduce the power consumption of re-programmable ASSP, ASIC, SoC (System-on-Chip), FPGA, CPLD and the like.

Another advantage of employing the ViLA circuitry is that it does not require special semiconductor manufacturing process. For example, the mature semiconductor manufacturing process for non-volatile memory technologies such as select gate and/or split gate flash technologies can be used to fabricate the ViLA circuitry. Similarly, the ViLA circuitry can also be manufactured using a semiconductor fabrication process of EEPROM (Electrically Erasable Programmable Read-Only Memory), SONOS (Silicon-Oxide-Nitride-Oxide-Silicon), MONOS (Metal-Oxide-Nitride-Oxide-Silicon), or other CMOS based manufacturing processes such as those with under-lapped source/drain diffusions.

A ViLA, in one embodiment, includes a pair of physically isolated gates. One gate is used for programming and erasing the floating gate via F-N tunneling, while the other gate is used for logic operation. The logic operations include inverting, buffering, switching, performing look-up tables, multiplexing, and memory storing. The ViLA circuitry, in one embodiment, can be fabricated using the select gate flash process, split gate flash process, SONOS process, MONOS process, CMOS process with under-lapped source/drain diffusions, EEPROM process, or the like.

Figure 2:
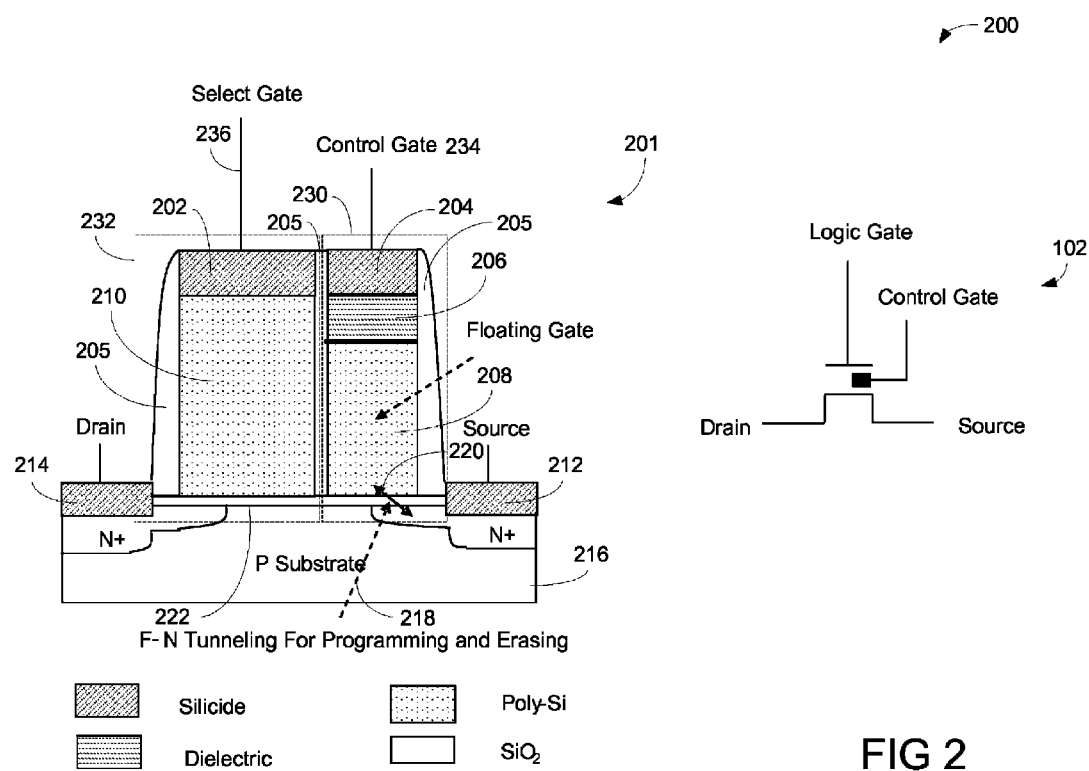
FIG. 2 is a schematic diagram illustrating a programmable transistor based on a select gate non-volatile memory process in accordance with one embodiment of the present invention.

FIG. 2 is a schematic diagram 200 illustrating a programmable transistor based on the select gate flash technology in accordance with one embodiment of the present invention. Diagram 200 includes a schematic diagram of ViLA 102 and a cross-section diagram of a transistor layout 201, wherein layout 201 is capable of implementing ViLA 102. The terms layout 201, programmable transistor, transistor, and ViLA can be used interchangeably hereinafter. Layout 201, in this embodiment, illustrates a programmable transistor that can be constructed using a select gate flash process. It should be noted that the underlying concept of the exemplary embodiment(s) of the present invention would not change if one or more blocks (layer or elements) were added to or removed from diagram 200.

Layout 201 includes a p-type substrate 216, a select gate portion 232, and a control gate portion 230. A layer of silicide is deposited over p-type substrate 216 to form a drain 214 on one side of substrate 216 and another layer of silicide is deposited to form a source 212. Select gate portion 232 and control gate portion 230 are separated by spacers 205, wherein spacers 205 are made of silicon dioxide ($SiO_2$) or silicon nitride ($Si_3N_4$). Select gate portion 232 includes a layer of polycrystalline silicon (Poly-Si) 210 over a layer of SiO2 222, which separates select gate portion 232 from p-type substrate 216. A select gate is formed by depositing a silicide layer 202 over Poly-Si 210.

Control gate portion 230 includes a silicide layer 204, a dielectric layer 206, and a poly-si 208, wherein control gate portion 230 is separated from substrate 216 by layer 222. A control gate terminal 234 is formed at layer 204 and a floating gate is formed at layer 208. Control gate terminal 234 is used to program (or erase) the device while a select gate terminal 236 is used to perform the logic. It should be noted that the scope of the embodiment(s) of the present invention does not change if layers are removed from or added to layout 201, such as adding a contact layer.

Referring back to FIG. 2, layout 201 is an n-type transistor, which includes twin gates 230-232 implemented in a select gate flash memory process. A p-type substrate 216 has two buried N+ junctions, one being source 212 and another being drain 214. Above a channel between source 212 and drain 214 has a layer of silicon dioxide 222, which forms an electrical isolation layer over the channel. Two poly-silicon gates are deposited over silicon dioxide layer 222. A poly-silicon gate (select gate) 232 controls the channel directly across the tunnel oxidation as a conventional CMOS transistor does, and another poly-silicon gate (control gate) 230, which is electrically isolated from select gate 232, controls a floating gate.

With voltage applications of control gate 230 and source 212, the floating gate can be programmed or erased. The programming is performed when control gate 230, for example, is connected to high positive voltage potential while source 212 is either grounded or connected to a negative voltage potential. The voltage difference attracts electrons from substrate 216 to the floating gate via Fowler-Nordheim ("F-N") tunneling 218. The erasing is performed when control gate 230 is connected to high negative voltage potential while source 212 is either grounded or connected to positive voltage potential. The voltage difference between control gate 230 and source 212 causes holes to move from substrate 216 to the floating gate via Fowler-Nordheim tunneling. In either scenario, the poly-silicon floating gate traps either additional electrons or holes.

The threshold voltage for layout or n-type transistor 201 increases as more electrons are stored in the floating gate. Upon accumulating sufficient amount of electrons, the elevated threshold voltage will prevent operational current flow in the channel, and will cause transistor 201 to be in logic "Off" state. When a negative voltage is applied to control gate terminal 234, the opposite vertical electrical field drives electrons from the floating gate to source 212 via tunneling through the channel oxidation as indicated by an arrow 220. When electrons stored in the floating gate reach a low level, transistor 201 returns to its initial state. If the application of the negative voltage continues, the holes begin to move from source 212 to the floating gate, which further reduces the threshold voltage. The increasing number of holes in the floating gate will cause a decrease to the threshold voltage, which renders transistor 201 to be in logic "On" state. When transistor 201 is in the logic state of "On", the channel current will operate in response to the voltages between drain 212 and source 214 regardless of the voltage level on select gate terminal 236, which is also known as erasing.

It should be noted that a p-type transistor can be similarly structured as its n-type counterpart except that an n-well will be deposited and formed in the p-type substrate and two buried p+ junctions should also be diffused or implanted. One buried p+ junction will be the source while the other one is the drain. During programming and erasing, the voltage polarities should change as oppose to the n-type transistor.

Figure 3:
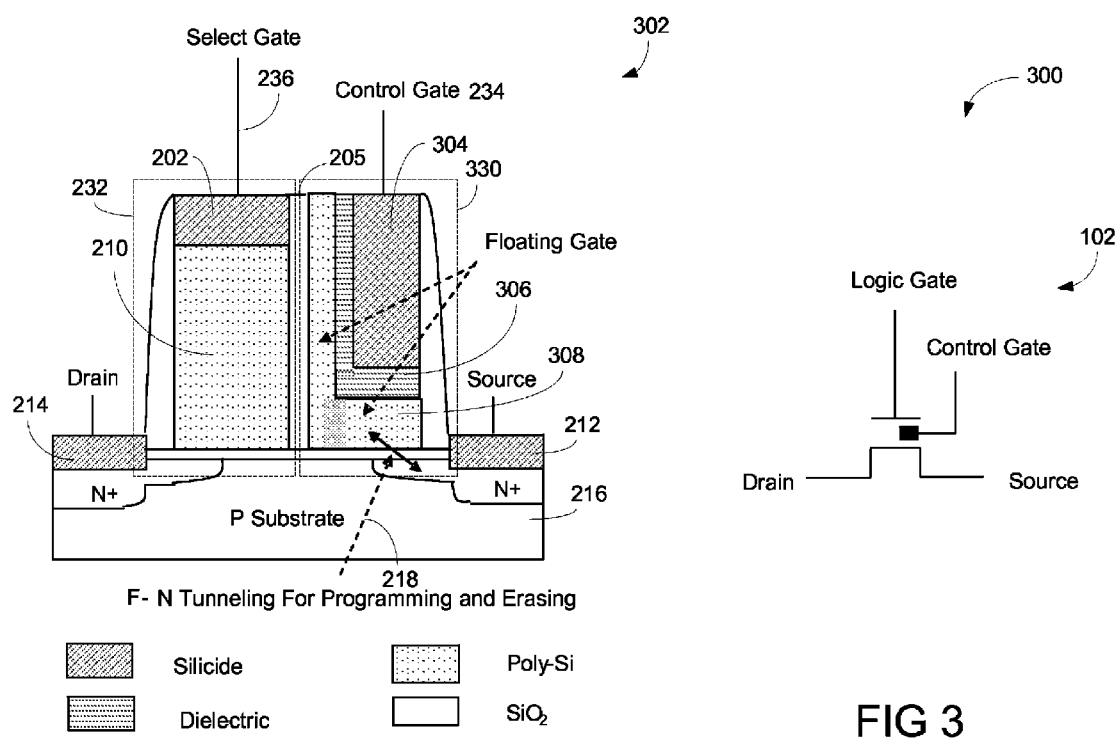
FIG. 3 is a schematic diagram illustrating a programmable transistor based on a split gate non-volatile memory process in accordance with one embodiment of the present invention.

FIG. 3 is a schematic diagram 300 illustrating a programmable transistor based on a split gate flash technology in accordance with one embodiment of the present invention. Diagram 300 includes a schematic diagram of ViLA 102 and a cross-section diagram of a transistor or transistor layout 302, wherein layout 302 is capable of implementing ViLA 102. Layout 302, in this embodiment, illustrates a programmable transistor that can be constructed using a split gate flash process. It should be noted that the underlying concept of the exemplary embodiment(s) of the present invention would not change if one or more blocks (layers or elements) were added to or removed from diagram 300.

Layout 302, in one embodiment, performs the same or substantially the same function as layout 201, illustrated in FIG. 2, except that control gate portion 230 in layout 201 is structurally different from portion 330 in layout 302. For example, poly-Si layer 308, dielectric layer 306, and silicide layer 304 of layout 302 are deposited in a well-shape structure. Layout 302 essentially illustrates an n-type ViLA transistor, which is implemented with split gate process for flash memory devices. It should be noted that for split gate flash technology, programming and erasing of a transistor for both n-type and p-type are similar to those of select gate flash process, illustrated in FIG. 2.

Figure 4:
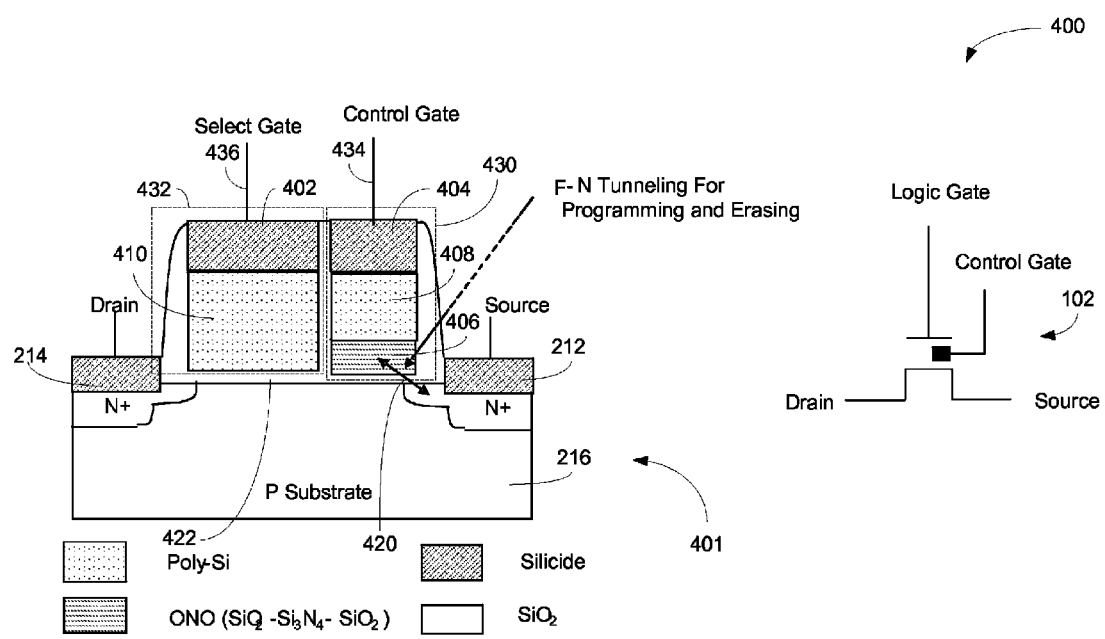
FIG. 4 is a schematic diagram illustrating a programmable transistor based on an alternative select gate non-volatile memory process in accordance with one embodiment of the present invention.

FIG. 4 is a schematic diagram 400 illustrating a programmable transistor based on an alternative select gate process using SiO2/Si3N4/SiO2 ("ONO") in accordance with one embodiment of the present invention. Diagram 400 includes a schematic diagram of ViLA 102 and a cross-section transistor 401 or transistor layout, wherein layout 401 is capable of implementing ViLA 102. Layout 402, in this embodiment, illustrates a programmable transistor that can be constructed using a split gate process having silicon-oxide-nitride-oxide-silicon ("SONOS") based memory cell. It should be noted that the underlying concept of the exemplary embodiment(s) of the present invention would not change if one or more blocks (layers or elements) were added to or removed from diagram 400.

Layout 401, in one embodiment, is an n-type cell with an ONO layer. A p-type substrate 216 has two buried N+ junctions, wherein one buried N+ junction is used to form a source 212 and other one is used to form a drain 214. Above the channel is a layer of silicon dioxide 422, wherein the thickness of the layer 422 is preferably less than 80 angstroms, and it provides an electrical isolation between substrate 216 and the gates. A poly-silicon gate 430 is deposited over the top of silicon dioxide layer 422. Gate 430 includes an ONO layer 406, a poly-Si layer 408, and a silicide layer 404, wherein the thickness of ONO layer 406 is preferably less than 15 nm (nanometer). Poly-silicon gate 430 is electrically isolated from the side ONO layer 406 and connected upwards to a conductive gate 434 of silicide layer 404. The side ONO layer 406 is used to trap carriers as in a conventional SONOS-based memory.

Control gate terminal 434 is connected to external voltage supply for the purpose of programming and erasing the transistor 401. ONO layer 406 forms a memory retention layer to trap either electrons or holes as they are injected into the layer via Fowler-Nordheim tunneling 420. ONO layer 406, in one embodiment, connects through poly-silicon 408 to a conductive gate terminal of silicide layer 404. With poly-silicon gate or select gate 432 for logic gate control, cell 401 has a side ONO layer, which is located in the vicinity of source 212. During programming and/or erasing, control gate terminal 434 is applied with high voltage potential, either positive or negative, while source 212 is grounded. The programming and erasing is implemented via Fowler-Nordheim tunneling 420, which occurs at the vicinity of source 212 and SONOS layer 406 through tunnel oxidation. It should be noted that select gate portion 432 performs similar function as select gate portion 232, shown in FIG. 2.

When a positive voltage is applied to control gate terminal 434, the vertical electrical field attracts electrons from source 212 to ONO layer 406 by jumping over or tunneling through the barrier as indicated by arrow 420, commonly known as tunneling. Upon tunneling through the oxidation or tunnel oxidation 422, electrons are trapped in ONO layer 406. The threshold voltage increases as more electrons are trapped in ONO layer 406. When sufficient electrons are accumulated, the elevated threshold voltage will prohibit any current flow in the channel. As such, cell 401 is in the logic state "Off". When negative voltage is applied to control gate 430, the opposite vertical electrical field is generated and it causes the stored electrons in the ONO layer 406 to travel back to source 212 by tunneling through channel oxidation 422. When trapped electrons are released, cell 401 returns to its initial state and will operate as a normal CMOS n-type transistor. If the application of the negative voltage continues, the holes begin to move from source 212 to ONO layer 406. The increasing number of holes will cause to decrease the threshold voltage. High concentration of holes drives down the threshold voltage level to a point in which cell 401 is in a logic state of "Always On". When cell 401 is in logic state "on", the flow of channel current will depend on the voltage difference between drain 214 and source (Vds) 212 regardless of the voltage level on select gate 436.

A p-type SONOS cell can also be fabricated in a similar manner as n-type SONOS cell 401. Also, p-type SONOS cell can perform similar functions as the n-type SONOS cell except that p-type SONOS cell requires opposite power polarity than the n-type SONOS cell. It should be noted that an MONOS cell can also be used to implement ViLA circuitry, wherein the MONOS cell has similar physical structures and properties as SONOS cell except that the top layer of control gate for MONOS is a metal layer.

Figure 5:
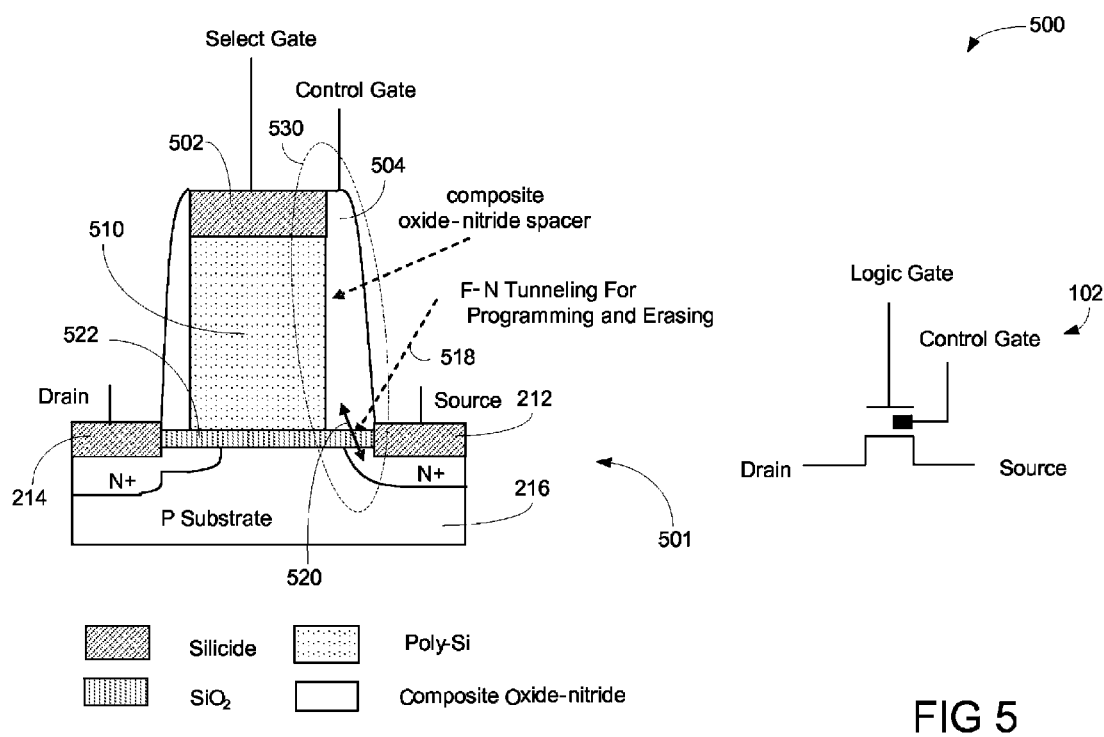
FIG. 5 is a schematic diagram illustrating a programmable transistor based on a CMOS process with under-lapped source and drain diffusions in accordance with one embodiment of the present invention.

FIG. 5 is a schematic diagram 500 illustrating a programmable transistor based on a CMOS process with under-lapped source and drain diffusions in accordance with one embodiment of the present invention. Diagram 500 includes a schematic diagram of ViLA 102 and a cross-section layout 501 of a transistor, wherein layout 501 is capable of implementing ViLA 102. The terms layout 501, cell, programmable transistor, transistor, and ViLA can be used interchangeably hereinafter. Layout 501, in this embodiment, illustrates a cross-section view of a programmable transistor, which is fabricated using a CMOS process with under-lapped source and drain diffusions. It should be noted that the underlying concept of the exemplary embodiment(s) of the present invention would not change if one or more blocks (layers or elements) were added to or removed from diagram 500.

Layout 501, in one embodiment, is similarly structured as layout 201 except that control gate portion 530 is different from control gate portion 230. Control gate portion 530 includes a composite oxide-nitride spacer 504, which is capable of storing electrons or holes. For example, layout 501 is a non-volatile memory cell, which may be obtained by blocking the source extension-implants and creating an under-lapped gate of diffusion structure. In other words, the transistor or cell 501 can be fabricated with a single thickness gate oxide using n-channel metal-oxide field-effect transistor ("nMOSFET") with source extension/halo implants block mask.

Cell 501 has an under-lapped diffusion structure, which allows electrons and/or holes to tunnel into composite oxide-nitride spacer 504 when the potential bias is sufficiently high between the under-lapped source and the control gate. Electrons or holes stored in spacer 504 are capable of modulating the channel threshold voltage or source resistance of the cell to make this cell "always On", "always Off" or behave like a regular CMOS transistor. The concentration of stored electrons can change when trapped electrons are released to source 212. Alternatively, the concentration of stored electrons can also change when holes tunnel into spacer 504. Cell

501, in one embodiment, is capable of operating at a voltage range between less than 1 volts ("V") and 3.5V. It should be noted that the operating voltage range between less than 1V and 3.5V can be supplied via standard power supplies without the use of charge pumps.

It should be noted that a p-type CMOS cell can be similarly structured as its n-type counterpart except that an n-well is formed in the p-type substrate and two buried p+ junctions are subsequently diffused or implanted in the well. One buried p+ junction is designated to a source 212 while the other one is designated to a drain 214. During programming and/or erasing, the application of the voltage polarities needs to be reversed as oppose to n-type CMOS transistor.

Figure 6:
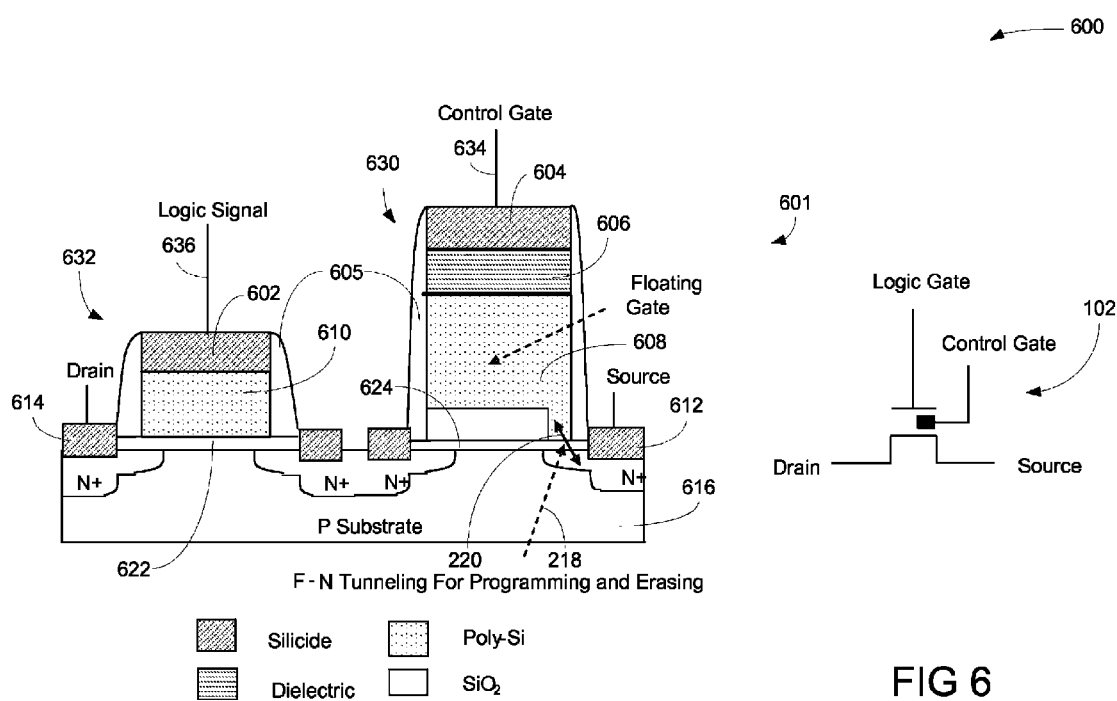
FIG. 6 is a schematic diagram illustrating a programmable transistor based on a two-transistor EEPROM process in accordance with one embodiment of the present invention.

FIG. 6 is a schematic diagram 600 illustrating a programmable transistor based on a two-transistor EEPROM process in accordance with one embodiment of the present invention. Diagram 600 includes a schematic diagram of ViLA 102 and a cross-section view of a transistor layout 601, wherein layout 601 can be used to implement ViLA 102. Layout 601, in this embodiment, illustrates a programmable transistor or ViLA 102 that can be fabricated using a two-transistor EEPROM process. It should be noted that the underlying concept of the exemplary embodiment(s) of the present invention would not change if one or more blocks (circuit or elements) were added to or removed from diagram 600.

Layout 601 includes a p-type substrate 616, a logic gate portion 632, and a control gate portion 630. A layer of SiO$_2$ 622 is deposited over p-type substrate 616 to form a drain 614 on one side of substrate 616 and another layer of SiO$_2$ 624 is deposited over another end of p-type substrate 616 to form a source 612. Logic gate portion 632 and control gate portion 630 are separated by spacers 605, wherein spacers 605 are made of silicon dioxide (SiO$_2$) or silicon nitride (Si$_3$N$_4$). Logic gate portion 632 includes a layer of polycrystalline silicon (Poly-Si) 610 over layer of SiO2 622, which separates logic gate portion 632 from p-type substrate 616. A logic gate 636 is formed by depositing a silicide layer 602 over Poly-Si 610.

Control gate portion 630 includes a silicide layer 604, a dielectric layer 606, and a poly-Si 608, wherein a control gate terminal 634 is formed at layer 604. Control gate portion 630 is separated by layer 624 and a floating gate is formed between layer 624 and layer 606. Control gate terminal 634 is used to program (or erase) the non-volatile memory element or the floating gate while logic gate terminal 636 is used to perform the logic functions. It should be noted that the scope of the embodiment of the present invention does not change if additional layers are added to or removed from layout 601.

Referring back to FIG. 6, layout 601 is an n-type ViLA, which includes two gates 630-632 manufactured by a two-transistor process of EEPROM cell. A p-type substrate 616 has three buried N+ junctions wherein one junction is designated as a source 612 and another junction is designated as a drain 614. In one embodiment, a word line ("WL") or logic signal 636 of an EEPROM cell is used for the logic operation while control gate 630 is used for programming the cell. It should be noted that the logic functions of the EEPROM cell are similar to the functions provided by the select gate cell and/or split gate cell.

Figure 7:
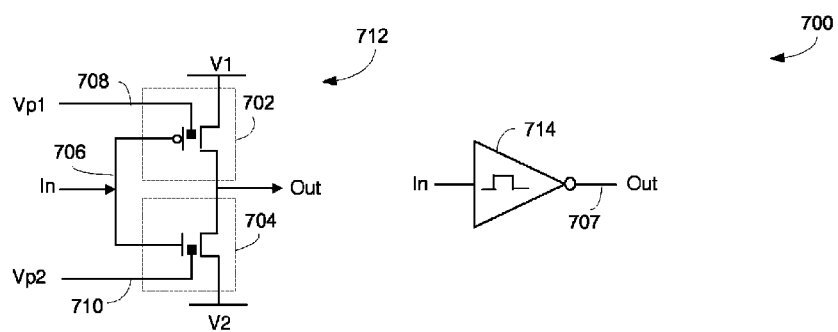
FIG. 7 is a schematic diagram illustrating a programmable logic circuit having two programmable transistors in accordance with one embodiment of the present invention.

FIG. 7 is a schematic diagram 700 illustrating a programmable logic circuit having two programmable transistors in accordance with one embodiment of the present invention. Diagram 700 includes a ViLA circuit 712 and a truth table 720, wherein ViLA circuit 712 is capable of performing various logic functions listed in truth table 720. Diagram 700 also includes a diagram 714, which is a ViLA circuit symbol for ViLA circuit 712. ViLA circuit 714 is also known as ViLA inverter. It should be noted that the underlying concept of the exemplary embodiment(s) of the present invention would not change if one or more blocks (circuit or elements) were added to or removed from diagram 700.

ViLA circuit 712 includes a p-type ViLA 702 and an n-type ViLA 704, wherein they are connected in an inverter configuration. For example, input 706 of ViLA circuit 712 is connected to gate terminals of ViLA 702-704 for providing an input signal. Output 707 of ViLA is connected to the drain terminal of ViLA 702 and the source terminal of ViLA 704 for outputting a result signal. The source terminal of ViLA 702 is connected to a first power supply V1 and the drain terminal of ViLA 704 is coupled to a second power supply V2. While control gate signal Vp1 708 is coupled to the control gate terminal of ViLA 702, control gate signal Vp2 710 is coupled to the control gate terminal of ViLA 704. It should be noted that when floating gates of ViLA 702-704 are not active, ViLA circuit 712 can perform an inverter function, buffer function, switching off, logic high or logic low.

In view of truth table 720, ViLA based inverter 712 is capable of performing various functions, such as inverting, buffering, switching, outputting constant voltage levels, and storing two bits non-volatile data. In addition to the input signal at the gate terminals of ViLA circuit 712, ViLA operation mode also depends on the concentration of the charges and polarity of the charges stored in the floating gates. For example, when p-type ViLA 702 stores strong negative charge in its floating gate and n-type ViLA 704 stores strong positive charge in its floating gate, ViLA circuit 712 performs an inverter function. Alternatively, when the voltage level at the source terminal of p-type ViLA 702 changes from Vcc to Ground ("Gnd") and the voltage level at the drain terminal of n-type ViLA 704 changes from Gnd to Vcc, ViLA circuit 712 performs a buffering function. It should be noted that buffering function can be useful in a mixed signal application.

To implement a function of switching-off, output of ViLA circuit 712 is high impedance. For instance, when p-type ViLA 702 accumulates sufficient amount of holes (positive charge) in its floating gate, the threshold voltages of ViLA 702 increases because the positive charge in the floating gate repels positive charge carriers from the channel region of ViLA 702. If the concentration of the positive charge stored in ViLA 702 is large enough, the elevated threshold voltage will be sufficient to ensure that ViLA 702 will be turned off regardless the voltage levels (Vcc or Vss) applied to the gate terminals of ViLA 702. Similarly, when n-type ViLA 704 accumulates sufficient electrons (negative charge) in its floating gate, the threshold voltage of n-type ViLA 704 increases because the negative charge repels negative charge carriers from the channel region of n-type ViLA 704. If the concentration of negative charge stored in the transistor is large enough, the elevated threshold voltage will be sufficient to ensure that n-type ViLA 704 will be turned off regardless the voltage applied to the gate terminal of n-type ViLA 704. Since both ViLAs 702-704 are in logic off state, the output of ViLA circuit 712 is high impedance.

To implement a function of providing logic high, output of ViLA circuit 712 outputs a logic one or high. For example, when p-type ViLA 702 accumulates considerable amount of electrons (negative charge) in its floating gate, the threshold voltage of p-type ViLA 702 decreases because the negative charge stored in ViLA 702 attracts positive charge carriers to the channel region of ViLA 702. If the concentration of negative charge stored in ViLA 702 is large enough, the threshold voltage will be low enough to ensure that ViLA 702 will be turned on regardless the voltage at the gate terminal of ViLA 702, wherein the voltage range can change from Vcc to Vss.

At the same time, n-type ViLA 704 accumulates considerable amount of electrons (negative charge) in its floating gate, the threshold voltage of ViLA 704 increases because of the negative charges, which repel negative charge carriers from the channel region of ViLA 704. If the concentration of negative charge stored in ViLA 704 is large enough, the elevated threshold voltage will be sufficient to ensure that ViLA 704 will be turned off regardless the voltage at the gate terminal of ViLA 704. As such, ViLA circuit 712 provides a constant high voltage at its output terminal.

To implement a function of providing logic low, output of ViLA circuit 712 outputs a logic zero or low. For instance, when there are considerable holes (positive charge) stored in p-type transistor 702, the threshold voltage of p-type transistor 702 increases because the positive charge stored in the transistor 702 repels positive charge carriers from the channel region of p-type transistor 702. If the concentration of positive charge stored in the transistor 702 is large enough, the threshold voltage will be offset by the amount sufficient to ensure that p-type transistor 702 will be turned off regardless the voltage applied at the input terminal transistor 702. At the same time, there are considerable amount of holes (positive charge) stored in n-type transistor 704, the threshold voltage of n-type transistor 704 decreases because the positive charge stored in the transistor attracts negative charge carriers to the channel region of n-type transistor 704. If the concentration of positive charge stored in the transistor 704 is large enough, the threshold voltage will be offset by the amount sufficient to ensure that n-type transistor 704 will be turned on regardless the voltage applied to its gate terminal. As a result, ViLA circuit 712 is capable of providing a constant low voltage at its output terminal.

An advantage of using a ViLA based inverter is to generate and maintain a stable "0" or "1" at its output using leakage current difference between the NMOS and PMOS transistors. For example, if Vt of PMOS is larger than NMOS and PMOS is "off" and NMOS is "on", the difference will discharge the output node to zero. If Vt of PMOS is smaller than NMOS and NMOS is "off" and PMOS is "on", the difference will charge the output node to Vcc or near Vcc. In one phenomenon, the trapped charges in the transistors, for example, are sufficient to cause the transistors to stay logic on or off state. Similarly, if the transistors are not completely on or off, the sub-threshold leakage current difference fulfills and maintains a stable logic "0" or "1" at the output regardless of input voltage at the input terminal or gate terminal of the transistor.

Another advantage of using a ViLA based inverter is that the information relating to the current modes of a ViLA based inverter is non-volatile. As such, after turning down the power, the information stored in the floating gates or the spacer remains in the transistors until the information is being erased or reprogrammed.

Figure 8:
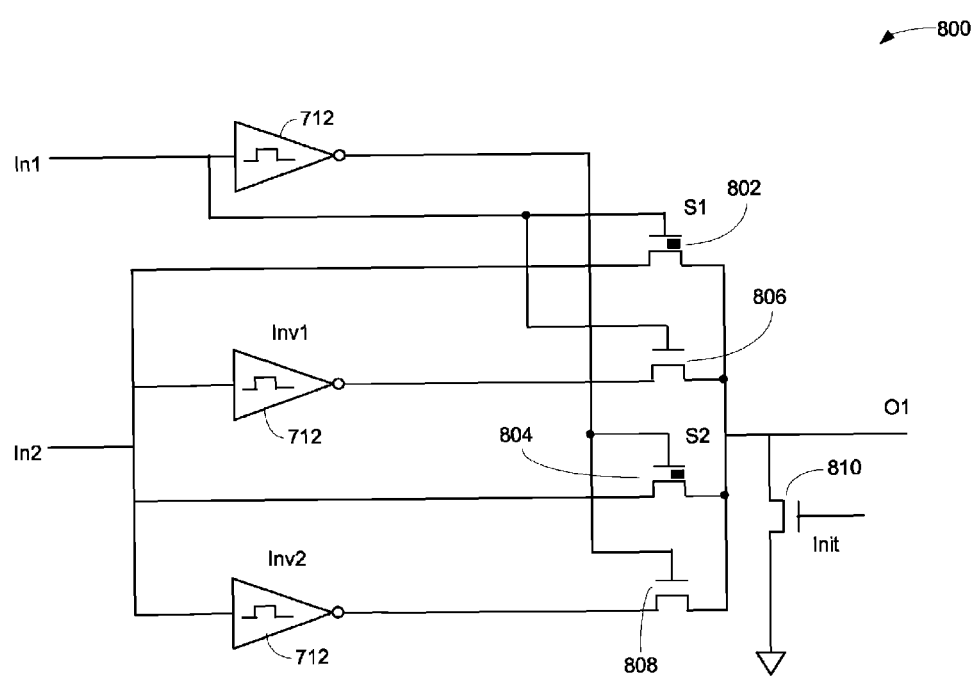
FIG. 8 is a schematic diagram illustrating a ViLA device capable of implementing a two-input look-up table in accordance with one embodiment of the present invention.

FIG. 8 is a schematic diagram 800 illustrating a ViLA device capable of implementing a two (2)-input look-up table in accordance with one embodiment of the present invention. Diagram 800 illustrates a ViLA device, which includes three ViLA inverters 712, two n-type ViLAs 802-804, and three transistors 806, 808 and 810. ViLA device 800 is capable of receiving two inputs In1-In2 and generating one output O1. It should be noted that the underlying concept of the exemplary embodiment(s) of the present invention would not change if one or more blocks (circuit or elements) were added to or removed from diagram 800.

ViLA device 800, in one embodiment, is capable of implementing various functions listed in a 2-Input look-up table. Device 800 further includes an initializing control transistor 810, which initiates an initialization procedure. With the help of the transistor 810, two pass switches 802-804 can be programmed to assist implementation of the 2-input look-up table. Because of programmability of the ViLA circuitry, the functionalities of ViLA device 800 is more versatile than a traditional 2-input look-up table. In one embodiment, ViLA device 800 is capable of performing functions listed in Table 1, 2 and 3, shown below.

TABLE 1

ViLA based look-up-table ("LUT")

| Function | Inv1 | Inv2 | S1 | S2 |
|---|---|---|---|---|
| AND2 | Off | 0 | On | Off |
| AND21(Not In1) | 0 | Off | Off | On |
| AND22(Not In2) | Inv | 0 | Off | Off |
| AND23(Not In1/2) | 0 | Inv | Off | Off |
| NAND2 | Inv | 1 | Off | Off |
| NAND21 | 1 | Inv | Off | Off |
| NAND22 | Off | 1 | On | Off |
| NAND23 | 1 | Off | Off | On |
| OR2 | 1 | Off | Off | On |
| OR21 | Off | 1 | On | Off |
| OR22 | 1 | Inv | Off | Off |
| OR23 | Inv | 1 | Off | Off |

TABLE 2

ViLA based LUT2

| Function | Inv1 | Inv2 | S1 | S2 |
|---|---|---|---|---|
| NOR2 | 0 | Inv | Off | Off |
| NOR21 | Inv | 0 | Off | Off |
| NOR22 | 0 | Off | Off | On |
| NOR23 | Off | 0 | On | Off |
| XOR2 | Inv | Off | Off | On |
| XOR21 | Off | Inv | On | Off |
| XOR22 | Off | Inv | On | Off |
| XOR23 | Inv | Off | Off | On |
| XNOR2 | Off | Inv | On | Off |
| XNOR21 | Inv | Off | Off | On |
| XNOR22 | Inv | Off | Off | On |
| XNOR23 | Off | Inv | On | Off |

TABLE 3

ViLA based LUT2

| Function | Inv1 | Inv2 | S1 | S2 |
|---|---|---|---|---|
| Inv1(In1) | 0 | 1 | Off | Off |
| Inv2(In2) | Inv | Inv | Off | Off |
| Buf1(In1) | 1 | 0 | Off | Off |
| Buf2(In2) | Off | Off | On | On |
| Logic 0 | 0 | 0 | Off | Off |
| Logic 1 | 1 | 1 | Off | Off |
| Switch Off | Off | Off | Off | Off |
| Memory Bit | 0/1 | 0/1 | Off | Off |
| Memory Bit | A LUT2 may have two bits when In1 is used as address. | | | |

It should be noted that additional inputs may be added to ViLA device 800 wherein multiple ViLA devices can be cascaded to implement multiple 2-input look-up tables.

A ViLA transistor capable of implementing 2-input look-up table, in one embodiment, is configured to implement logic functions, such as AND2, NAND2, OR2, NOR2, XOR2, XNOR2, and the derivatives of input permutation and negation. An advantage of using a ViLA device capable of implementing a look-up table is to simplify circuit complexity as well as power conservation partially because all the unused transistors can be turned off. It should be noted that a more than 2-input look-up table can be obtained by cascading multiple of 2 input look-up tables.

Figure 9:
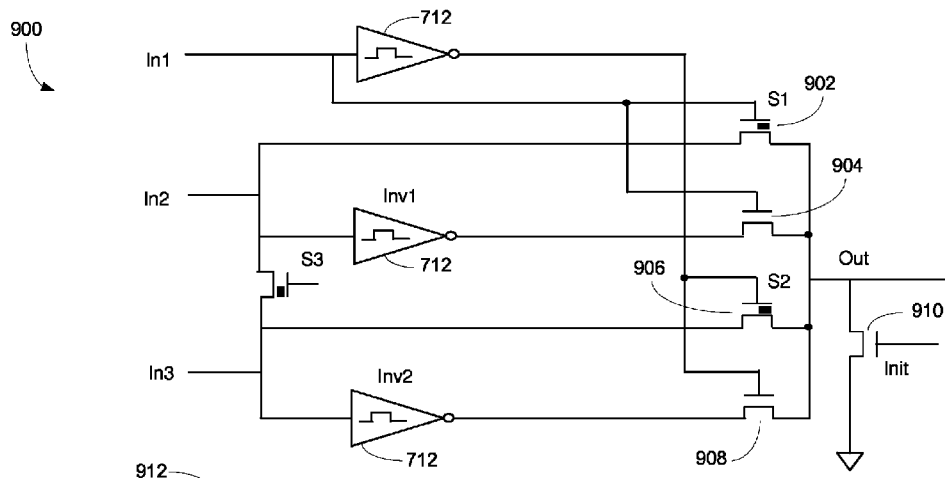
FIG. 9 illustrates a ViLA device 900 capable of implementing a two-input look-up table and 2-1 multiplexing using ViLA circuits in accordance with one embodiment of the present invention.

FIG. 9 illustrates a ViLA device 900 capable of implementing a two (2)-input look-up table and 2-1 multiplexing using ViLA circuits in accordance with one embodiment of the present invention. Device 900 is structurally similar to device 800 except that device 900 is capable of receiving an additional input In3. In addition, device 900 also includes an additional ViLA S3, which is situated between input 2 and input 3. With the addition of ViLA S3 and input In3, a 2-1 multiplexer or a 3-1 static multiplexer can be implemented based on a 2 input look-up table as illustrated in truth table 912.

In addition to the functions listed in table 1, 2, and 3 as shown earlier, device 900 is also capable of performing a dynamic 2-1 multiplexing as shown in truth table 912. Device 900 is further configured to perform a static 3-1 static multiplexing as shown in truth table 912. More function can be performed if additional ViLA circuits are added.

Figure 10:
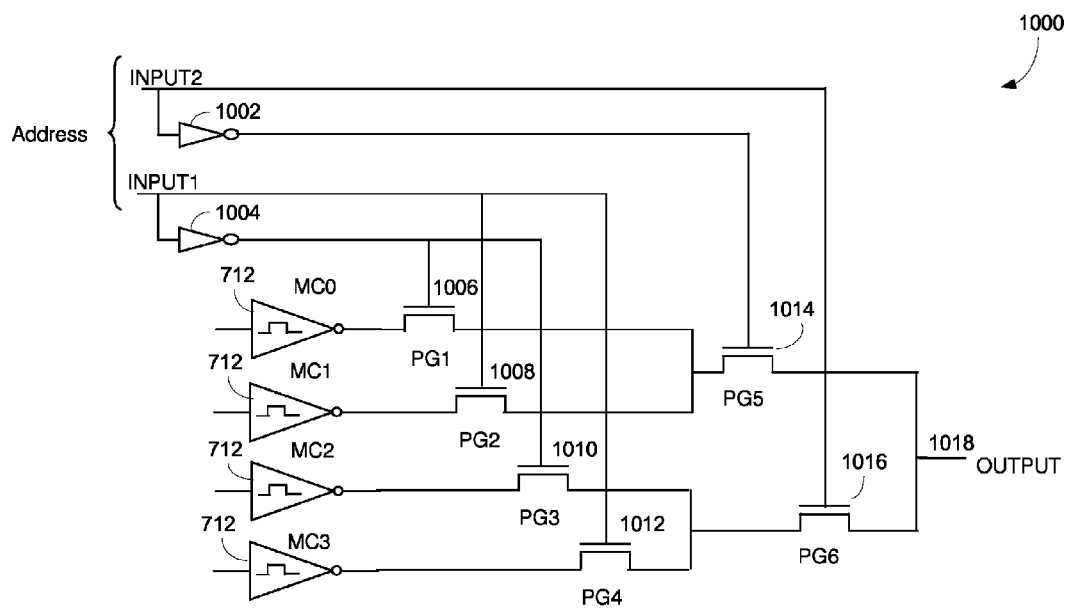
FIG. 10 is a schematic diagram illustrating a four-bit non-volatile memory cell based programmable transistors in accordance with one embodiment of the present invention.

FIG. 10 is a schematic diagram illustrating a four (4)-bit non-volatile memory cell 1000 based on programmable transistors in accordance with one embodiment of the present invention. Cell 1000 includes four ViLA inverters 712, six pass gates 1006-1016, and two inverters 1002-1004. The address lines are used to control the output 1018. It should be noted that the underlying concept of the exemplary embodiment(s) of the present invention would not change if one or more blocks (circuit or elements) were added to or removed from cell 1000.

ViLA transistors and inverters are used to create a non-volatile memory cell, such as a 4-bit non-volatile memory cell shown in FIG. 10. Cell 1000 is capable of storing up to 4 bit non-volatile information. As can be seen, any other combinatory logic functions can be implemented by the ViLA circuit(s).

The exemplary embodiment(s) of the present invention includes various processing steps, which will be described below. The steps of the embodiments may be embodied in machine or computer executable instructions. The instructions can be used to cause a general purpose or special purpose system, which is programmed with the instructions to perform the steps of the present invention. Alternatively, the steps of the present invention may be performed by specific hardware components that contain hard-wired logic for performing the steps, or by any combination of programmed computer components and custom hardware components.

Figure 11:
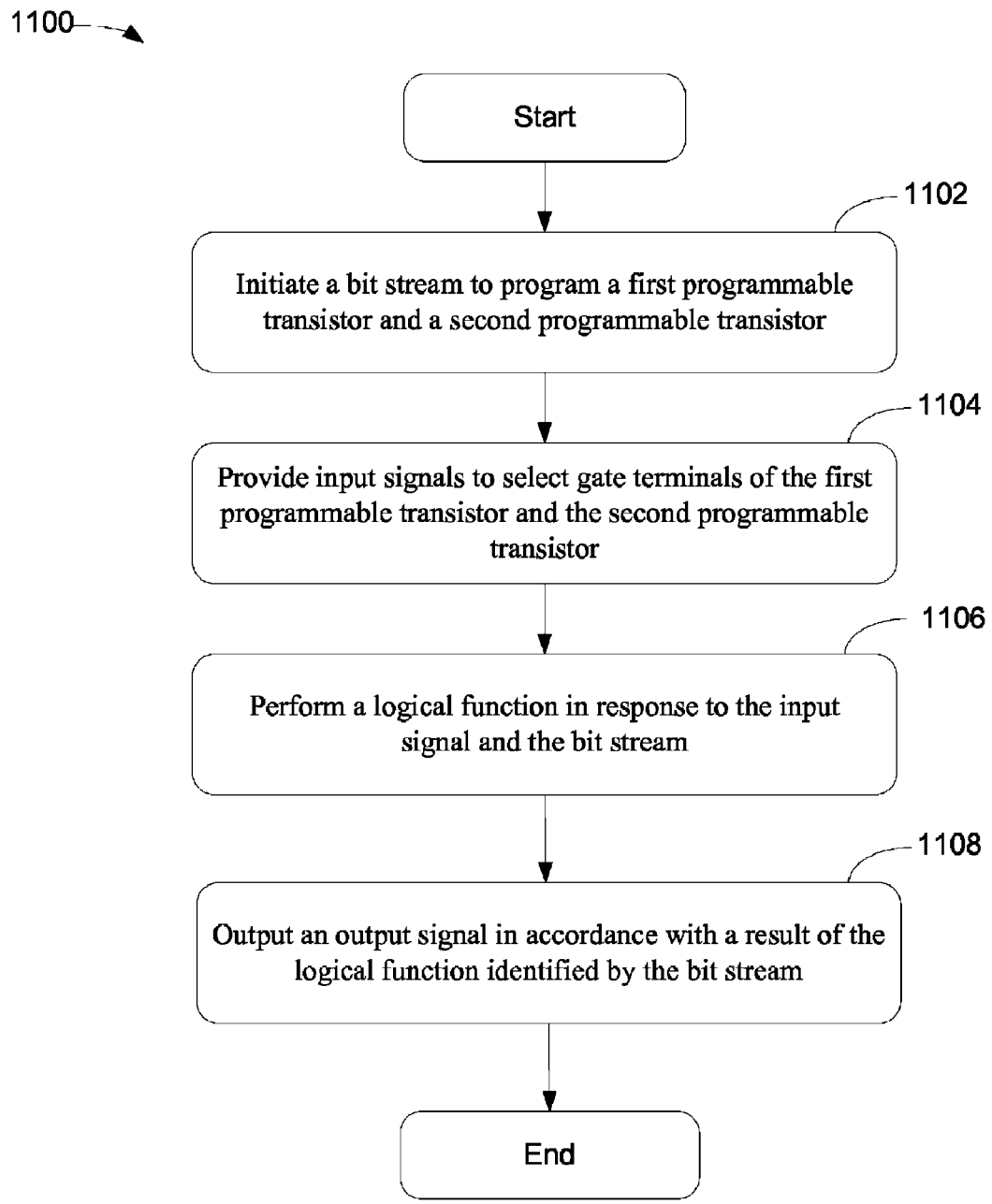
FIG. 11 is a flowchart illustrating a process of providing a logic function using multiple programmable transistors in accordance with one embodiment of the present invention.

FIG. 11 is a flowchart 1100 illustrating a process of providing a logic function using multiple programmable transistors in accordance with one embodiment of the present invention. At block 1102, a process initiates a bit stream to program a first programmable transistor and a second programmable transistor. In one embodiment, the process is also capable of providing programming signals to control gates of the first and the second programmable transistors in accordance with the bit stream. After block 1102, the process proceeds to the next block.

At block 1104, the process provides an input signal to the select gate terminals of the first programmable transistor and the second programmable transistor. In one embodiment, the process is also capable of driving the output signal to logic one (1) state in response to leakage current difference. After block 1104, the process proceeds to the next block.

At block 1106, the process performs a logical function in response to the input signal and the bit stream. For example, the process can perform an inverter function in response to the input signal. Alternatively, the process is also capable of performing a buffering function to amplify input signal. After block 1106, the process proceeds to the next block.

At block 1108, the process outputs an output signal in accordance with a result of the logical function identified by the bit stream. The process is further capable of performing logic functions in accordance with a lookup table. After block 1108, the process ends.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope all such changes and modifications as are within the true spirit and scope of the exemplary embodiment(s) of the present invention.

What is claimed is:

1. A programmable transistor, comprising:
    a non-volatile memory element capable of storing information in accordance with control signals on a control signal terminal; and
    a logic element coupled to the non-volatile memory element and configured to include a logic gate terminal, a source terminal, and a drain terminal, wherein the logic element is capable of performing a switching logic function when logic value at the control signal terminal is inactive and logic value at the logic gate terminal is active.

2. The transistor of claim 1, wherein the switching logic function is a pass gate function.

3. The transistor of claim 1, wherein the switching logic function is a transmission gate function when two or more transistors are utilized.

4. The transistor of claim 1,
    wherein the non-volatile memory element includes a first isolated gate capable of storing non-volatile information for providing non-volatile memory capability; and
    wherein the logic element includes a second isolated gate, configured to share a common substrate, capable of processing logic signals for performing a logic function, wherein the first isolated gate and the second isolated gate are fabricated on a die.

5. The transistor of claim 1, wherein the non-volatile memory element is one of flash memory, silicon-oxide-nitride-oxide-silicon ("SONOS") memory, metal-oxide-nitride-oxide-silicon ("MONOS") memory, and under-lapped source CMOS memory.

6. The transistor of claim 1, wherein the information stored in the non-volatile memory element is able to program the transistor between a logic element and a static element.

7. The transistor of claim 1, wherein the switching logic function passes logic value at the source terminal to the drain terminal.

8. A programmable transistor, comprising:
    a non-volatile memory element capable of storing information in accordance with control signals on a control signal terminal; and
    a logic element coupled to the non-volatile memory element and configured to include a logic gate terminal, a source terminal, and a drain terminal, wherein the logic element is capable of performing a buffering function when the logic value at the control signal terminal is inactive and logic value at logic gate terminal is active.

9. The transistor of claim 8, wherein the buffering function is a pass gate function.

10. The transistor of claim 8, wherein the buffering logic function is a transmission gate function when two or more transistors are employed.

11. The transistor of claim 8,
wherein the non-volatile memory element includes a first isolated gate capable of storing non-volatile information for providing non-volatile memory capability; and
wherein the logic element includes a second isolated gate, configured to share a common substrate, capable of processing logic signals for performing a logic function, wherein the first isolated gate and the second isolated gate are fabricated on a die.

12. The transistor of claim 8, wherein the non-volatile memory element is one of flash memory, silicon-oxide-nitride-oxide-silicon ("SONOS") memory, metal-oxide-nitride-oxide-silicon ("MONOS") memory, and under-lapped source CMOS memory.

13. The transistor of claim 8, wherein the information stored in the non-volatile memory element is able to program the transistor between a logic element and a static element.

14. The transistor of claim 8, wherein the buffering logic function passes logic value at the source terminal to the drain terminal.

15. A programmable transistor, comprising:
a non-volatile memory element capable of storing information in accordance with control signals on a control signal terminal; and
a logic element coupled to the non-volatile memory element and configured to include a logic gate terminal, a source terminal, and a drain terminal, wherein the logic element is capable of performing a static function when the logic value at the control signal terminal is active, wherein the static function provides a substantially constant logic value.

16. The transistor of claim 15, wherein the substantially constant logic value is high impedance.

17. The transistor of claim 15, wherein the substantially constant logic value is logic one (1).

18. The transistor of claim 15,
wherein the non-volatile memory element includes a first isolated gate capable of storing non-volatile information for providing non-volatile memory capability; and
wherein the logic element includes a second isolated gate, configured to share a common substrate, capable of processing logic signals for performing a logic function, wherein the first isolated gate and the second isolated gate are fabricated on a die.

19. The transistor of claim 15, wherein the non-volatile memory element is one of flash memory, silicon-oxide-nitride-oxide-silicon ("SONOS") memory, metal-oxide-nitride-oxide-silicon ("MONOS") memory, and under-lapped source CMOS memory.

* * * * *